United States Patent
Alic et al.

(10) Patent No.: US 10,348,411 B2
(45) Date of Patent: Jul. 9, 2019

(54) FREQUENCY ALIGNMENT OF OPTICAL FREQUENCY COMBS

(71) Applicant: Roshmere, Inc., San Diego, CA (US)

(72) Inventors: Nikola Alic, La Jolla, CA (US); Ping-Piu Kuo, San Diego, CA (US)

(73) Assignee: Roshmere, Inc., San Diego, CA (US)

( * ) Notice: Subject to any disclaimer, the term of this patent is extended or adjusted under 35 U.S.C. 154(b) by 0 days.

(21) Appl. No.: 16/027,020

(22) Filed: Jul. 3, 2018

(65) Prior Publication Data
US 2019/0013869 A1 Jan. 10, 2019

Related U.S. Application Data (60) Provisional application No. 62/528,750, filed on Jul. 5, 2017.

(51) Int. Cl.
| | |
|---|---|
| *G02F 1/39* | (2006.01) |
| *H01S 3/08* | (2006.01) |
| *H01S 5/10* | (2006.01) |
| *H01S 5/40* | (2006.01) |
| *H01S 3/108* | (2006.01) |
| *H04B 10/50* | (2013.01) |

(52) U.S. Cl.
CPC ............. *H04B 10/501* (2013.01); *G02F 1/39* (2013.01); *H01S 3/08086* (2013.01); *H01S 3/1083* (2013.01); *H01S 5/1092* (2013.01); *H01S 5/4087* (2013.01)

(58) Field of Classification Search
CPC .. H01S 3/08086; H01S 3/1083; H01S 5/1092; H01S 5/4087; G02F 1/39
See application file for complete search history.

(56) References Cited

U.S. PATENT DOCUMENTS

| | | |
|---|---|---|
| 7,123,402 B1 | 10/2006 | Doerr et al. |
| 8,447,155 B1 | 5/2013 | Kuo et al. |
| 8,451,528 B1 | 5/2013 | Kuo |
| 2007/0166048 A1 | 7/2007 | Doerr et al. |
| 2011/0267625 A1 | 11/2011 | Guelachvili et al. |
| 2014/0064734 A1 | 3/2014 | Witzens |
| 2014/0133815 A1 | 5/2014 | Kuo |
| 2014/0178020 A1 | 6/2014 | Kuo et al. |
| 2015/0325978 A1 | 11/2015 | Fertig et al. |
| 2015/0326320 A1 | 11/2015 | Fertig et al. |
| 2017/0180054 A1* | 6/2017 | Kiuchi ................... H04B 10/90 |

OTHER PUBLICATIONS

International Search Report dated Nov. 16, 2018 for PCT Patent Application No. PCT/US2018/040815.

\* cited by examiner

*Primary Examiner* — Casey L Kretzer
(74) *Attorney, Agent, or Firm* — MLO, a professional corp.

(57) ABSTRACT

A system includes a first optical frequency comb generator that generates a first parametrically generated comb using parametric mixing comprising a first plurality of optical waves including at least one first optical wave. The system includes a second optical frequency comb generator that generates a second parametrically generated comb using parametric mixing comprising a second plurality of optical waves. The second optical frequency comb generator receives the at least one first optical wave and generates the second plurality of optical waves using the at least one first optical wave. Respective center frequencies of one or more optical waves of the first plurality of optical waves are aligned in frequency with respective center frequencies of one or more optical waves of the second plurality of optical waves.

17 Claims, 6 Drawing Sheets

FREQUENCY ALIGNMENT OF OPTICAL FREQUENCY COMBS

RELATED APPLICATIONS

The application claims the benefit of U.S. Provisional Patent Application No. 62/528,750 filed on Jul. 5, 2017 and entitled "Frequency Locking Optical Frequency Combs;" and is related to U.S. patent application Ser. No. 13/725,836 filed on Dec. 21, 2012 and entitled "Method and Apparatus for Generation of Coherent Frequency Combs" issued as U.S. Pat. No. 8,451,528; which claims the benefit of U.S. Provisional Patent Application No. 61/700,823 filed on Sep. 13, 2012 and entitled "Method and Apparatus for Generation of Coherent Frequency Combs"; all of which are hereby incorporated by reference for all purposes.

BACKGROUND

An optical or radio-frequency (RF) source is commonly referred to as a frequency comb when it is represented by multiple tones that are equidistantly spaced in the frequency domain. Optical frequency combs are one of the key elements in Fourier analysis, which, in turn is fundamental to the operation and analysis of linear systems. Explicitly, an optical frequency comb is a set of lines equally spaced (in this context) in frequency. In the engineering practice, optical frequency combs are used in metrology (taking advantage of their uniform pitch) whereas in optics they represent an indispensable tool for signal processing. Additionally, optical frequency combs may be of benefit in wavelength division multiplex (WDM) transmission systems which are organized as multi-channel systems, each channel occupying a pre-assigned frequency bin (often of 50 GHz), where they can serve either as carriers of information, or local oscillators at the receiving end of an optical link, used for the demodulation and retrieval of information. Thus, the ability to align, or lock, optical frequency combs mutually in frequency is critical in a number of disciplines.

SUMMARY

In some embodiments, a system for frequency alignment of optical frequency combs includes a first optical frequency comb generator that generates a parametrically generated comb using parametric mixing comprising a first set of optical waves including at least one first optical wave. The system additionally includes a second optical frequency comb generator that generates a parametrically generated comb using parametric mixing comprising a second set of optical waves. The second optical frequency comb generator receives the at least one first optical wave. Respective center frequencies of one or more optical waves of the second set of optical waves are aligned in frequency with respective center frequencies of one or more optical waves of the first set of optical waves using the at least one first optical wave.

In some embodiments, a system for frequency alignment of optical frequency combs includes a first optical frequency comb generator that generates a parametrically generated comb using parametric mixing comprising a first set of optical waves including a first optical wave. The first set of optical waves are characterized by respective center frequencies separated from each other by a first frequency spacing, and the first optical wave is characterized by a first center frequency. Additionally, the system includes a second optical frequency comb generator that generates a parametrically generated comb using parametric mixing comprising a second set of optical waves. The second set of optical waves are characterized by respective center frequencies separated from each other by a second frequency spacing. The second optical frequency comb generator additionally includes an optical modulator optically coupled to the first optical frequency comb generator to: (i) receive the first optical wave, and (ii) output at least two second optical waves using the first optical wave. The second optical frequency comb generator additionally includes an optical mixer optically coupled to the optical modulator to: (i) receive the at least two second optical waves, and (ii) mix the at least two second optical waves to output the second set of optical waves. Respective center frequencies of one or more optical waves of the first set of optical waves are aligned in frequency with respective center frequencies of one or more optical waves of the second set of optical waves.

In some embodiments, a system includes a network that comprises a plurality of optical frequency comb generators that generate parametrically generated combs using parametric mixing. The network further includes a master optical frequency comb generator that generates a parametrically generated comb comprising a first plurality of optical waves including at least one first optical wave, a first predecessor optical frequency comb generator that generates a parametrically generated comb comprising a second plurality of optical waves, and one or more additional predecessor optical frequency comb generators that generate parametrically generated combs comprising subsequent pluralities of optical waves. The network also includes a hierarchical order of alignment for the plurality of optical frequency comb generators in the network. The first predecessor optical frequency comb generator receives the at least one first optical wave, and the respective center frequencies of one or more optical waves of the second plurality of optical waves are aligned in frequency with respective center frequencies of one or more optical waves of the first plurality of optical waves using the at least one first optical wave.

DETAILED DESCRIPTION

Embodiments disclosed herein relate to systems for generation of two or more wideband, highly coherent frequency combs having one or more respective optical frequency lines ("tones") that are mutually locked, or aligned, in frequency relative to each other. Optical frequency combs ("combs") represent the optical output spectra from multi-line emitters characterized by equally-spaced emission lines in the frequency domain. Two combs, of the same, or similar pitch can be mutually frequency locked, or referenced, by using an emission line from the output spectrum of the first comb as a reference for frequency and/or phase alignment of one or more other combs. The (at least) two combs can be at physically different locations. Frequency and phase alignment of optical frequency combs is of interest in metrology, as well as in optical communication systems which rely on comb sources as the carriers of information and as local oscillators.

In some embodiments, optical frequency comb generation is accomplished by seeding (with a "seed line") a parametric optical mixer using phase correlated optical sources having different carrier frequencies. In some embodiments, the parametric optical mixer can include more than one waveguides. In some embodiments, the waveguides with the nonlinear optical medium are configured to mix at least two input optical waves to generate a plurality of optical waves. In accordance with some embodiments, the creation of new frequency tones from seed frequencies is governed by energy and momentum conservation laws. As an illustration, first-order tones ($\omega_{1+}$ and $\omega_{1-}$) are created by a four-photon mixing process seeded by two waves $\omega_1$ and $\omega_2$ that are commonly referred to as pumps:

$$\omega_{1+} = 2\omega_2 - \omega_1 \quad \text{(Equation 1)}$$

$$\omega_{1-} = 2\omega_1 - \omega_2 \quad \text{(Equation 2)}$$

Equations 1 and 2 are a direct consequence of energy conservation during the mixing process. Thus, two continuous wave sources (tones) can be used to seed an optical mixer to generate new frequency tones possessing superior frequency stability. In an ideal mixing process, a large number of equidistant tones can be generated, creating a wideband optical frequency comb. Optical frequency combs that are produced using the methods described above can be referred to as "parametrically generated combs", in accordance with some embodiments. Parametric combs are described more completely in U.S. Pat. No. 8,447,155 entitled "Methods and apparatus for power-equalized optical frequency comb generation", and in U.S. Pat. No. 8,451,528 entitled "Method and apparatus for generation of coherent frequency combs", both of which are incorporated by reference herein in their entirety.

In some embodiments, mutual frequency locking/alignment between two combs generated using continuous wave sources is accomplished using one or more optical waves from a first (master) comb to tune/align a seed line that is used to generate a second (slave) comb. The first comb and the second comb (of either the same, or distinct, frequency pitch) are aligned, in some embodiments, by using one or more optical waves ("tones") of the first comb, and by optoelectronic means, tuning, or locking, a seed line of the second comb to an optical wave of the first comb. Because the first comb and the second comb are thus referenced to a single master line, the entire second comb is shifted such that one or more tones of the first comb and the second comb are mutually aligned in frequency.

In some embodiments, a master comb generator contains, or is coupled to, different hardware, and/or can have a different configuration, than a slave (or, in a network environment with more than two comb generators, a predecessor) comb generator. For example, a master comb generator can utilize a high quality optical source (e.g., a laser with a stable frequency) to seed the comb generator, whereas a slave (or predecessor) comb generator can utilize a lower quality optical source. In some embodiments, a slave can also contain a frequency shifter and/or a translator (e.g., an optical modulator to form two seed tones from a single seed tone received from a master or predecessor comb generator). The modulator in this example is used for frequency shifting, or splitting, to generate the fundamental mixing cell, which is subsequently extended in a parametric mixer, as opposed to a comb generation method in which all the comb in its entirety is created by one, or more optical modulators.

In some embodiments, the comb alignment process involves injection locking of one or more second parametric comb seed lines. Injection locking and injection pulling are frequency effects that can occur when a harmonic oscillator is disturbed by a second oscillator operating at a nearby frequency. When the coupling of the first oscillator with the wave from the second oscillator source is strong enough and the respective frequencies near enough, the second oscillator can capture the first oscillator, causing it to have an identical (or almost identical) frequency as the second. This effect is referred to as injection locking and is pertinent to any kind of oscillation and oscillators, inclusive of optical oscillators, or lasers. Injection locking and pulling effects are observed in numerous types of physical systems, however the terms are most often associated with electronic oscillators or laser resonators, the latter of which is particularly relevant to the systems and methods described herein.

In some embodiments, the comb alignment process entails a feedback mechanism relying on using a frequency difference as an error signal that is being driven to, and maintained at, zero. The alignment is accomplished by frequency shifting the seed line of the second comb by current injection, or alternatively thermal tuning, to minimize the error signal. In some embodiments, at the end of this alignment process (which can be either a single occurrence, or occur continuously in time) the two combs are mutually aligned (if the original combs were designed to have the same pitches). In embodiments where the two combs are not of the same pitch, their seed lines are aligned but the rest of the respective tones are necessarily detuned.

In other embodiments, mutual frequency locking/alignment between two combs generated using continuous wave tones is accomplished using one or more optical waves from a first (master) comb as part of the comb formation process of the second (slave) optical frequency comb. Because combs, without such feedback, may drift in frequency, the frequency adjustment loop may need to be periodically enabled, or run continuously.

In some embodiments, one or more tones in first and second parametrically generated combs are aligned in frequency, but not aligned in phase. In other embodiments, one or more tones in first and second parametrically generated combs are aligned in frequency as well as aligned in phase.

Figure 1:
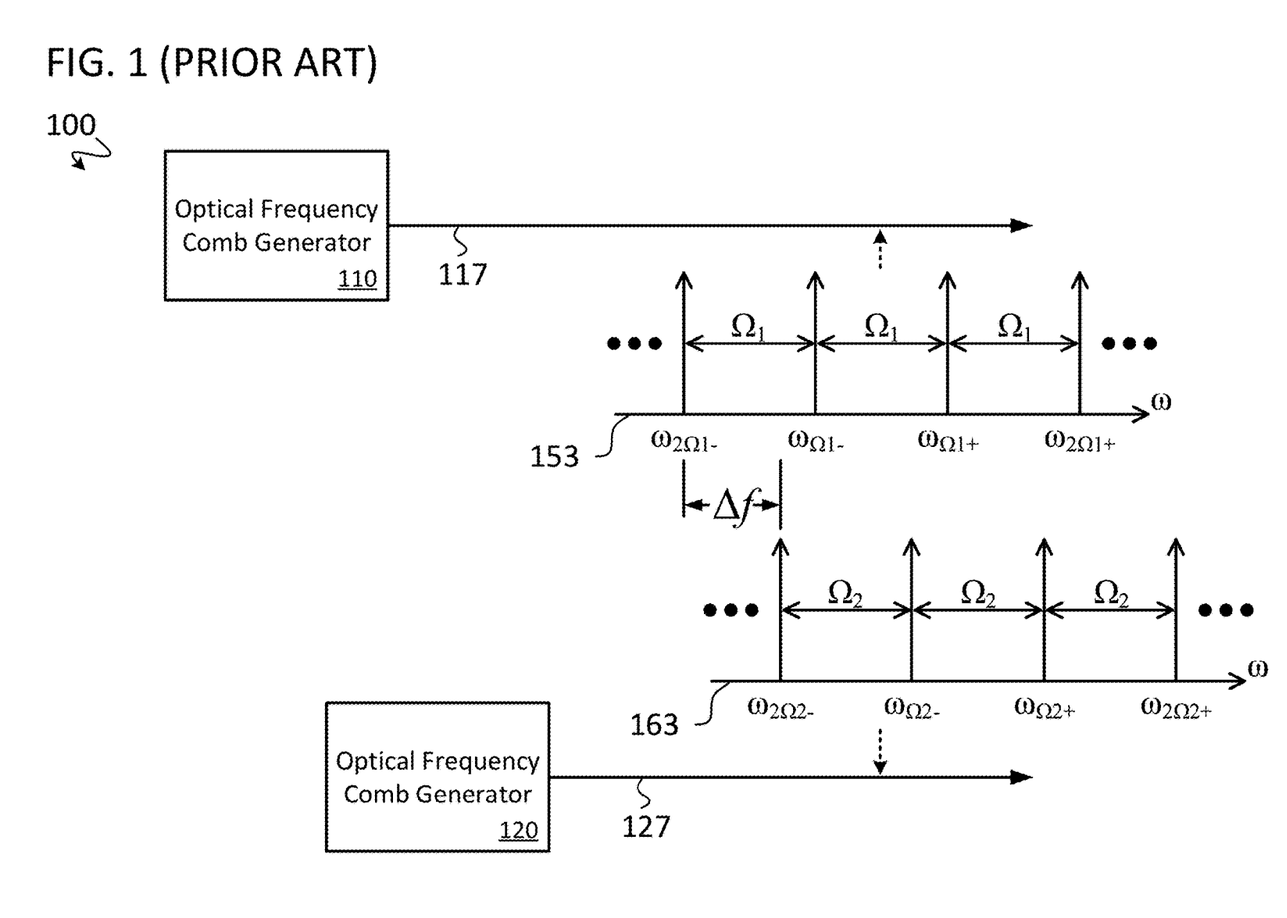
FIG. 1 is a prior art simplified schematic representation of a system having two optical frequency comb generators, in accordance with some embodiments.

FIG. 1 illustrates a simplified schematic representation of a prior art system 100 having two optical frequency comb generators ("comb generators") that each, respectively, generates an optical frequency comb ("comb") that are not necessarily aligned with each other. As shown, a first comb generator 110 is coupled to an optical link 117 (e.g., a fiber optic link), onto which the comb generator 110 launches a first comb 153. A second comb generator 120 is coupled to a second optical link 127 (e.g., a fiber optic link), onto which the second comb generator 120 launches a second comb 163. Center frequencies ($\omega$) of each of the tones of the first comb 153 have equidistant frequency spacing $\Omega_1$, and center frequencies ($\omega$) of each of the tones of the second comb 163 have equidistant frequency spacing $\Omega_2$. However, the second comb 163 is not aligned in frequency with the first optical frequency comb 153, as designated by the frequency separation $\Delta f$ between corresponding optical tones ($\omega_{2\Omega 1-}$ and $\omega_{2\Omega 2-}$) of the respective frequency combs 153 and 163.

Figure 2:
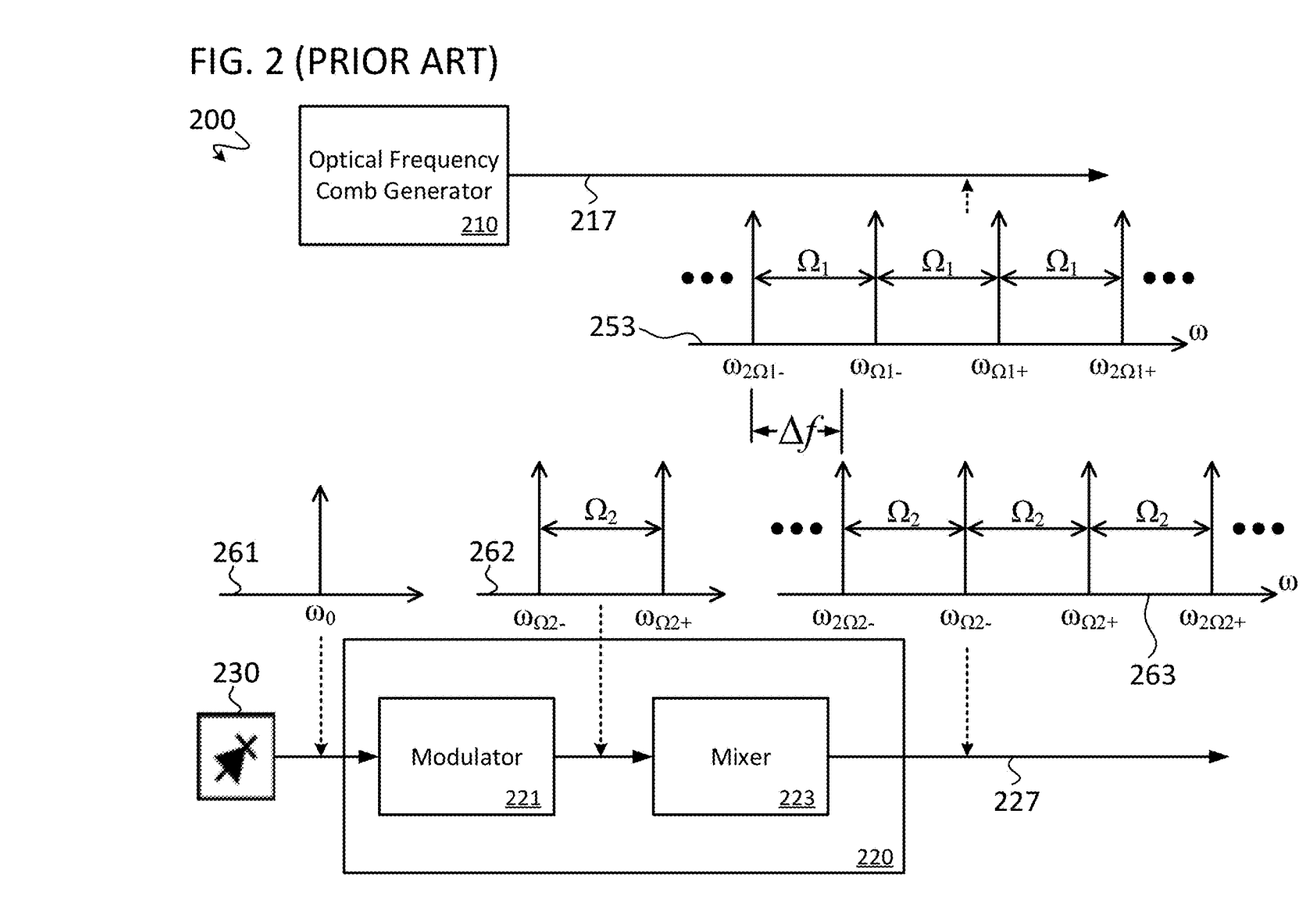
FIG. 2 illustrates another prior art simplified schematic representation of a system having two optical frequency comb generators, in accordance with some embodiments.

Additional details of an example embodiment of a second optical frequency comb generator 220 is included in a simplified schematic representations of a prior art system 200, as shown in FIG. 2. The prior art system 200 includes two optical frequency comb generators that each, respectively, generates an optical frequency comb that are not necessarily aligned with each other. As shown, a first optical frequency comb generator 210 is coupled to a first optical link 217, onto which the first comb generator 210 launches a first comb 253. The second optical frequency comb generator 220 is coupled to a second optical link 227, onto which the second comb generator 220 launches a second comb 263. The second comb generator is coupled to an optical source 230 (e.g., a laser) which provides a seed line for the second comb generator 220.

The second comb generator 220 includes an optical modulator 221 and optical mixer 223 to illustrate an example of a comb generator that utilizes an optical source 230 as a seed line. In some embodiments, the optical mixer 223 is a parametric optical mixer, and the generated comb is a parametrically generated comb. The optical mixer is a particular collection of nonlinear elements with certain dispersion characteristics which, when excited by 2 or more frequency tones spawn a comb. The optical modulator 221 is coupled to the optical source 230 and the optical mixer 223. The optical mixer 223 is coupled to the second optical link 227. The optical source 230 outputs a first optical wave 261 (e.g., a seed line). The first optical wave 261 is received at an input of the optical modulator 221. The optical modulator 221 modulates the first optical wave 261 to generate second optical waves 262. The second optical waves 262 include at least two distinct frequency tones separated by a frequency $\Omega_2=\omega_{\Omega 2+}-\omega_{\Omega 2-}$. The optical mixer 223 receives the second optical waves 262 and uses the second optical waves 262, and a nonlinear optical medium, to generate the second optical comb 263 (third optical waves).

As shown, center frequencies of the tones of the first comb 253 have equidistant frequency spacing $\Omega_1$, and center frequencies of the tones of the second comb 263 have equidistant frequency spacing $\Omega_2$. However, a center (or other) tone of the second optical frequency comb 263 is not aligned with a center (or other) tone of the first optical frequency comb 253. This is designated by the frequency separation $\Delta f$ between corresponding optical tones ($\omega_{2\Omega 1-}$ and $\omega_{2\Omega 2-}$) of the respective frequency combs.

Figure 3:
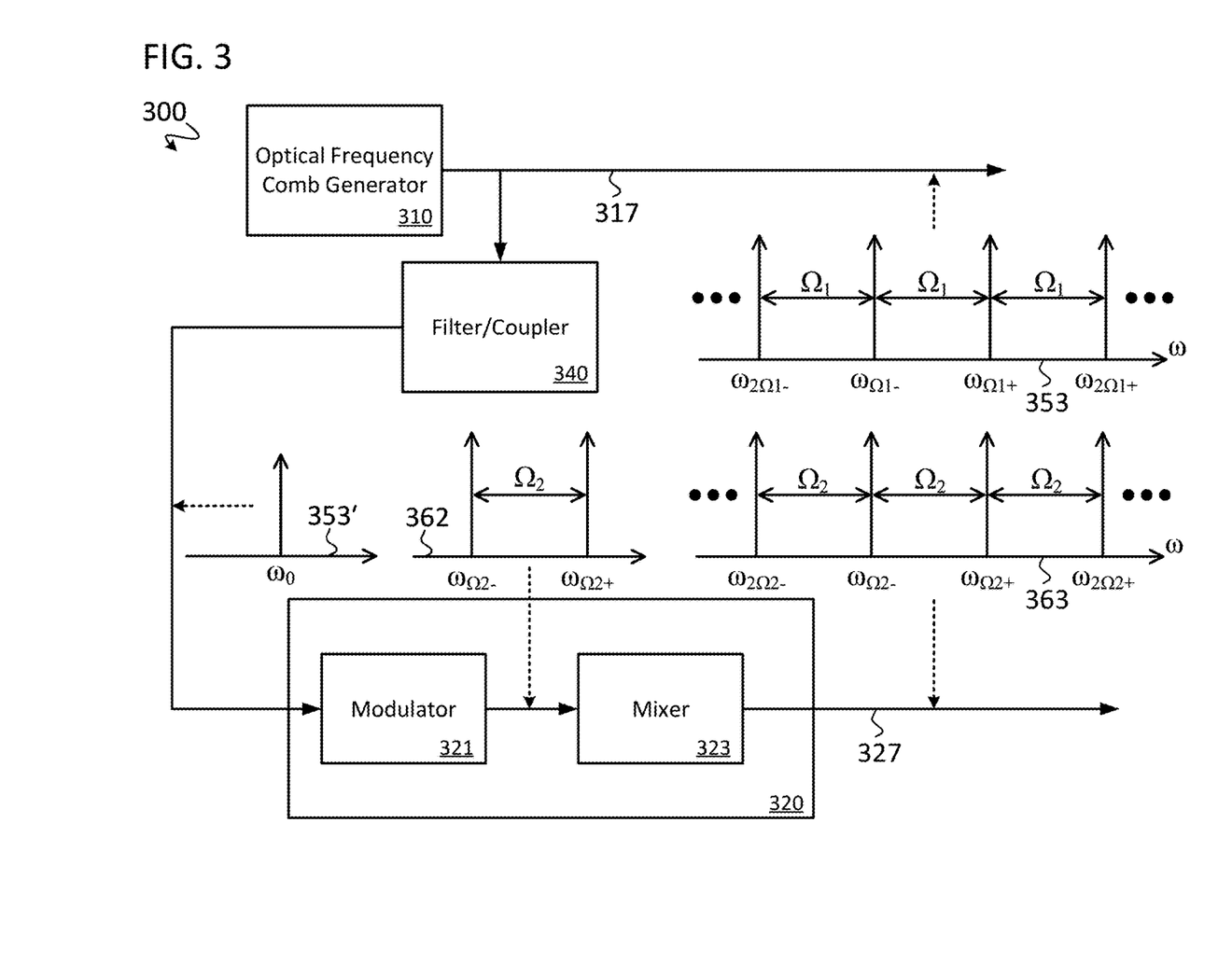
FIG. 3 illustrates a simplified schematic representation of a system for mutual frequency alignment of optical frequency combs, in accordance with some embodiments.

FIG. 3 illustrates a simplified schematic representation of an embodiment of a system 300 for mutual frequency alignment of parametrically generated optical frequency combs. In the embodiment shown, mutual frequency alignment between a first optical frequency comb and a second optical frequency comb is accomplished by using one or more tones of the first optical frequency comb to generate the second optical frequency comb.

As shown, the system 300 generally includes a first optical frequency comb generator 310, a second optical frequency comb generator 320, a first optical link 317, a second optical link 327, and an optical filter/coupler 340, among other components not shown for simplicity. The first optical frequency comb generator 310 is coupled to the first optical link 317, onto which it launches a first optical frequency comb 353. The second optical frequency comb generator 320 is coupled to the second optical link 327, onto which it launches a second optical frequency comb 363. The optical filter/coupler 340 is coupled to the first optical link 317 and to the second comb generator 320.

The second comb generator 320 includes an optical modulator 321 and an optical mixer 323. The optical modulator 321 is coupled to the filter/coupler 340 and the optical mixer 323. The optical modulator 321 is only one example, and in practice any frequency shifter or translator capable of forming two tones (e.g., the tones 362) from a single tone (e.g., the tone 353') with a predetermined frequency spacing can be used. The optical mixer 323 is coupled to the second optical link 327. The filter/coupler 340 causes one or more optical tones (e.g., one of $\omega_{2\Omega 1-}$ to $\omega_{2\Omega 1+}$) of the first optical frequency comb 353 to be received by the modulator 321. In the example shown, a first optical wave 353' (e.g., a single tone $\omega_0$ corresponding to one of the tones of the first optical frequency comb 353) is selected by the filter/coupler 340 (e.g., by active or passive filtering/optical coupling, or by signal reproduction) from the optical frequency comb 353 and is received by the optical modulator 321. The optical modulator 321 receives the first optical wave 353' and modulates it to generate second optical waves 362. The second optical waves 362 are characterized by respective center frequencies (e.g., $\omega_{\Omega 2+}$ and $\omega_{\Omega 2-}$) separated from each other by a second frequency spacing $\Omega_2=\omega_{\Omega 2+}-\omega_{\Omega 2-}$. The modulation can be accomplished by a conventional electro-optic modulator (EOM), including both phase or intensity modulators. The optical mixer 323 receives the second optical waves 362 and uses the second optical waves 362 and a nonlinear optical medium to generate the second optical comb 363 (third optical waves). In this case, the single tone 353' is a seed tone for the second comb generator 320, and the two tones 362 are the seed tones for the optical mixer 323. The single tone at the overall center frequency of the comb (e.g., element 353' in FIG. 3), and the two most central tones (e.g., element 362 in FIG. 3) within the comb (e.g., element 363 in FIG. 3) can all be referred to as center tones (or central tones). In some embodiments, one or more central tones from one comb are used as one or more seed lines of a second comb.

Center frequencies of the tones of the first comb 353 have equidistant frequency spacing $\Omega_1$, and center frequencies of the tones of the second comb 363 have equidistant frequency spacing $\Omega_2$. In some embodiments, $\Omega_1$ is equal to $\Omega_2$. In other embodiments, $\Omega_1$ is not equal to $\Omega_2$. However, having advantageously used the first optical wave 353' (directly from, or generated directly from, the first comb 353) as the optical input to the optical modulator 321, respective center frequencies of one or more optical waves (i.e., tones) of the first optical frequency comb 353 is/are aligned in frequency with respective center frequencies (tones) of the second optical frequency comb 363. In the case where $\Omega_1$ is not equal to $\Omega_2$ then generally the center frequency of one of the optical waves of the first optical frequency comb 353 is aligned in frequency with the respective center frequency (tone) of one tone of the second optical frequency comb 363. However, in the cases, where $\Omega_1$ is a multiple of $\Omega_2$ (or vice-versa), then the center frequencies of more than one optical waves of the first optical frequency comb 353 are aligned in frequency with the respective center frequencies (tones) of more than one tone the second optical frequency comb 363. In the case where $\Omega_1$ is equal to $\Omega_2$ then generally the center frequencies of all of the optical waves of the first optical frequency comb 353 are aligned in frequency with the respective center frequencies (tones) of all of tones of the second optical frequency comb 363.

Figure 4:
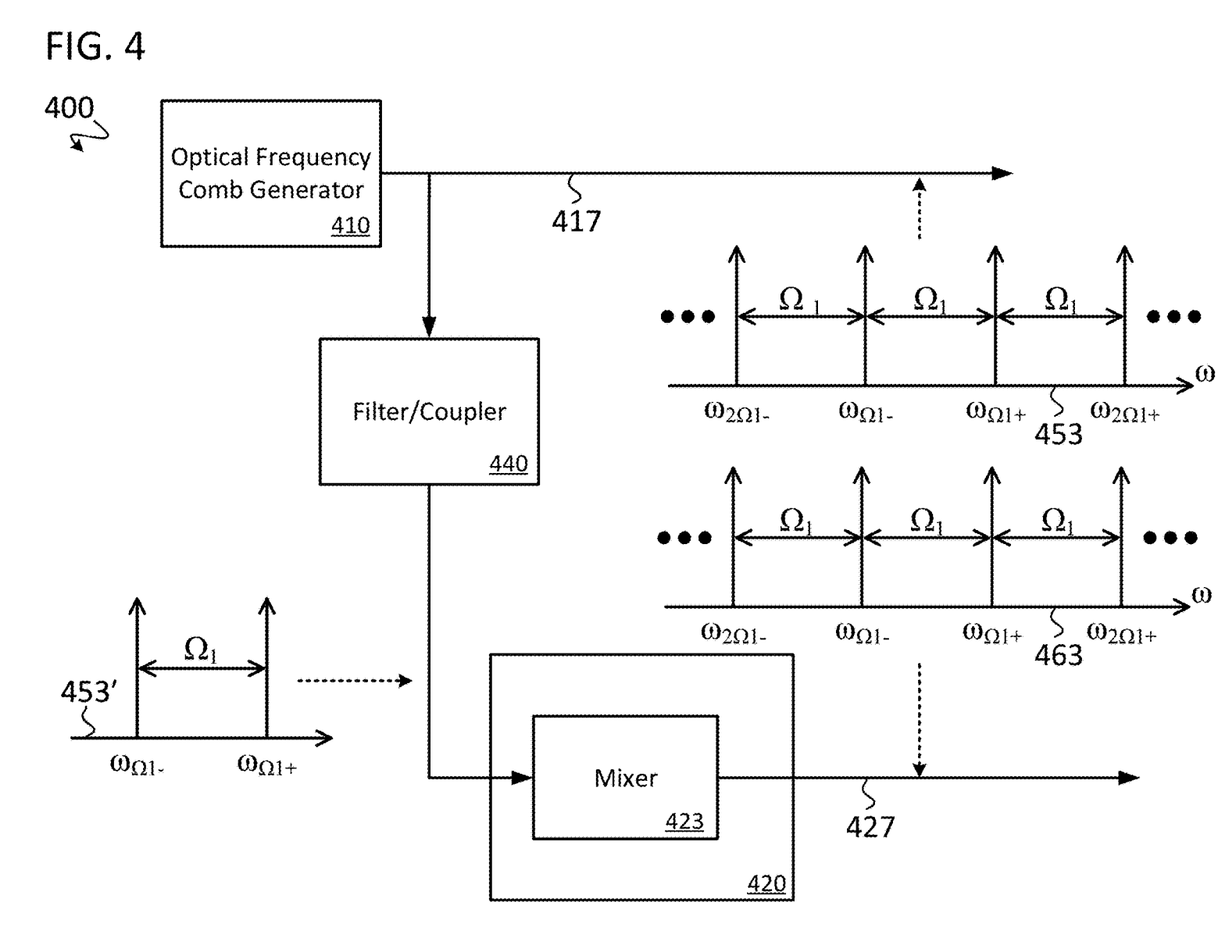
FIG. 4 illustrates a simplified schematic representation of another system for mutual frequency alignment of optical frequency combs, in accordance with some embodiments.

FIG. 4 illustrates a simplified schematic representation of another embodiment of a system 400 for mutual frequency alignment of parametrically generated optical frequency combs. In the embodiment shown, mutual frequency alignment between a first optical frequency comb and a second optical frequency comb is accomplished by using one or more tones of the first optical frequency comb to generate the second optical frequency comb.

As shown, the system 400 generally includes a first optical frequency comb generator 410, a second optical frequency comb generator 420, a first optical link 417, a second optical link 427, and an optical filter/coupler 440, among other components not shown for simplicity. The first optical frequency comb generator 410 is coupled to the first optical link 417, onto which the first comb generator 410 launches a first optical frequency comb 453. The second optical frequency comb generator 420 is coupled to the second optical link 427, onto which the second comb generator launches a second optical frequency comb 463. The optical filter/coupler 440 is coupled to the first optical link 417 and to the second comb generator 420.

The second comb generator 420 includes an optical mixer 423 that is coupled to the filter/coupler 440 and the second optical link 427. In some embodiments, the filter/coupler 440 causes two or more optical tones (e.g., two of $\omega_{2\Omega 1-}$ to $\omega_{2\Omega 1+}$) of the first optical frequency comb 453 to be received by the optical mixer 423. In other embodiments, the filter/coupler 440 receives one or more optical tones of the first optical frequency comb 453, and the filter/coupler 440 includes a nonlinear element, or time-varying element to split the one or more optical tones into two or more optical tones that are provided to the optical mixer 423, which generates comb 463 from those two or more tones. In the example shown, first optical waves 453' (having two tones, e.g., $\omega_{\Omega 1-}$ and $\omega_{\Omega 1+}$, the center frequencies of which are separated by the frequency spacing $\Omega_1$) are selected from the optical frequency comb 453 by the filter/coupler 440 and are then received by the optical mixer 423. The optical mixer 423 uses the first optical waves 453' and a nonlinear optical medium to generate the second optical comb 463 (second optical waves).

As shown, center frequencies of the tones of the first comb 453 have equidistant frequency spacing $\Omega_1$. The second optical comb 463 is characterized by multiple optical frequency tones which have the same equidistant frequency spacing $\Omega_1$. Thus, in the example embodiment shown, the second optical frequency comb 463 is of the same pitch as the first optical frequency comb 453. Furthermore, having advantageously used the first optical waves 453' (directly from, or generated directly from, the first comb 453) as the optical input to the optical mixer 423, respective center frequencies of all of the optical waves of the first optical frequency comb 453 are aligned in frequency with respective center frequencies (tones) of the second optical frequency comb 463. In other embodiments, the pitch of the first comb 453 and the second comb 463 are different (e.g., by using seed tones 453' with a different frequency spacing where one of the seed tones is aligned with one tone in comb 453), and the respective center frequency of one or more of the optical waves of the first optical frequency comb 453 is aligned in frequency with the respective center frequency (tones) of one or more of the tones of the second optical frequency comb 463.

Figure 5:
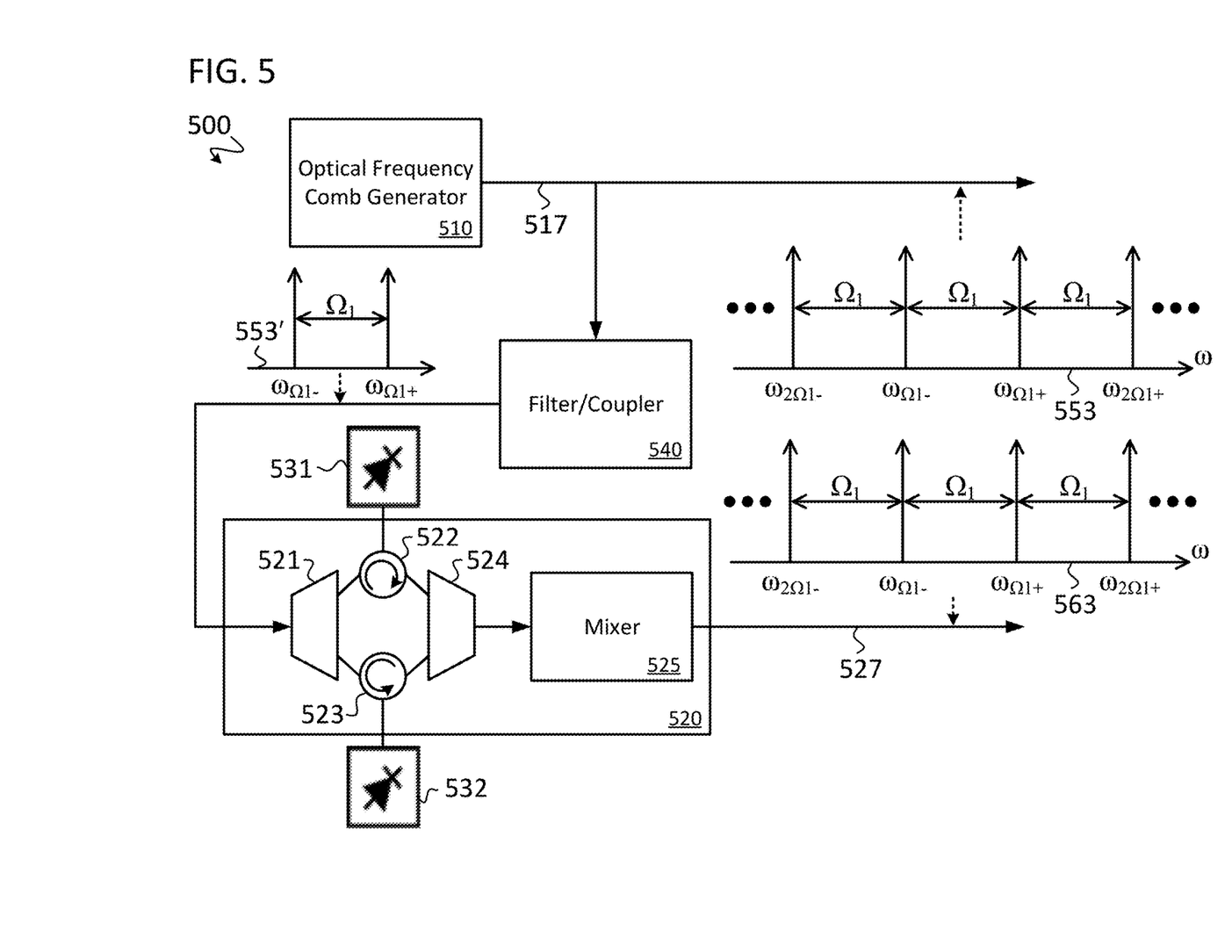
FIG. 5 illustrates a simplified schematic representation of yet another system for mutual frequency alignment of optical frequency combs, in accordance with some embodiments.

FIG. 5 illustrates a simplified schematic representation of yet another embodiment of a system 500 for mutual frequency alignment of parametrically generated optical frequency combs. In the embodiment shown, mutual frequency alignment between a first optical frequency comb and a second optical frequency comb is accomplished by using one or more tones of the first optical frequency comb to generate the second optical frequency comb.

As shown, the system 500 generally includes a first optical frequency comb generator 510, a second optical frequency comb generator 520, a first optical link 517, a second optical link 527, and an optical filter/coupler 540, among other components not shown for simplicity. The first optical frequency comb generator 510 is coupled to the first optical link 517, onto which the first comb generator 510 launches a first optical frequency comb 553. The second optical frequency comb generator 520 is coupled to the second optical link 527, onto which the second comb generator 520 launches a second optical frequency comb 563. The filter/coupler 540 is coupled to the first optical link 517 and to the second comb generator 520.

The second comb generator 520 includes an optical splitter 521, a first circulator 522, a second circulator 523, an optical combiner 524, and an optical mixer 525. The filter/coupler 540 is coupled to the first optical splitter 521. A first output of the optical splitter 521 is coupled to the first circulator 522 and a second output of the optical splitter 521 is coupled to the second circulator 523. The first circulator 522 and the second circulator 523 are coupled to the optical combiner 524, which is coupled to the optical mixer 525. The optical mixer 525 is coupled to the second optical link 527. Additionally, a first optical source 531 (e.g., a laser) is coupled to the first circulator 522, and a second optical source 532 (e.g., another laser) is coupled to the second circulator 523. In some embodiments, the first and second optical sources do not contain an optical isolator. In some embodiments, the system 500 includes other modules or elements which have been omitted for simplicity.

In some embodiments, the filter/coupler 540 causes two or more optical tones (e.g., two of $\omega_{2\Omega 1-}$ to $\omega_{2\Omega 1+}$) of the first optical frequency comb 553 to be received by the optical splitter 521. In other embodiments, the filter/coupler 540 receives one or more optical tones of the first optical frequency comb 553, and the filter/coupler 540 includes a nonlinear element, or time-varying element to split the one or more optical tones into two or more optical tones that are provided to the optical mixer 525, which generates comb 563 from those two or more tones. In the example shown, first optical waves 553' (having two tones, e.g., $\omega_{\Omega 1-}$ and $\omega_{\Omega 1+}$, the center frequencies of which are separated by the frequency spacing $\Omega_1$) are selected from the optical frequency comb 553 by the filter/coupler 540 and are then received by the optical splitter 521.

The optical splitter 521 splits the first optical waves 553' into the two tones. For example, tone $\omega_{\Omega 1-}$ can be contained within the first output of the optical splitter 521 and be coupled to the first circulator 522, and $\omega_{\Omega 1+}$ can be contained within the second output of the optical splitter 521 and be coupled to the second circulator 523. A first optical output from the first optical source 531 and a second optical output from the second optical source 532 are tuned by the first and second circulators 522 and 523, respectively, to a respective one of the tones provided by the optical splitter 521 using injection locking. The tuned first optical output and the tuned second optical output are combined by the optical combiner 524. The combined optical signal is then received by the optical mixer 525. The optical mixer 525 mixes the combined optical signal to generate the optical frequency comb 563. As shown, center frequencies of the tones of the first comb 553 have equidistant frequency spacing $\Omega_1$. The second optical comb 563 is characterized by multiple optical frequency tones which have the same equidistant frequency spacing $\Omega_1$.

Thus, in the example embodiment shown, the second optical frequency comb 563 is of the same pitch as the first optical frequency comb 553. Furthermore, having advantageously used the first optical waves 553' (directly from, or generated directly from, the first comb 553) as the optical input to the second optical frequency comb generator 520 (or the optical splitter 521), respective center frequencies of all of the optical waves of the first optical frequency comb 553 are aligned in frequency with respective center frequencies (tones) of the second optical frequency comb 563. In other embodiments, the pitch of the first comb 553 and the second comb 563 are different (e.g., by using seed tones 553' with a different frequency spacing where one or more of the seed tones is aligned with one tone in comb 553), and the respective center frequency of one of the optical waves of the first optical frequency comb 553 is aligned in frequency with the respective center frequency (tones) of one or more of the tones of the second optical frequency comb 563.

In some embodiments, the system shown in FIG. 5 can utilize only one optical source (i.e., either 531 or 532), and one circulator (i.e., either 522 or 523). In such cases there is no need for the splitter 521 or the optical combiner 524, but an optical modulator (not shown in FIG. 5) is needed before the mixer. For example, the filter/coupler 540 can select one tone from comb 553 (e.g., a single tone ωo corresponding to one of the tones of the first optical frequency comb 553, similarly to the example shown in 353' in FIG. 3), which can be coupled to one circulator (e.g., 522). The one tone can then be used to tune the one optical source (e.g., 531) using injection locking. The output of the one circulator (e.g., 522) can then be coupled to a frequency shifter or translator (e.g., an optical modulator similar to element 321 in FIG. 3), which will generate an additional tone with a particular frequency spacing (e.g., similar to the description with respect to elements 321 in FIG. 3). These two tones can then be coupled to the mixer 525 to generate the comb 563 (e.g., similar to the description with respect to elements 323 in FIG. 3).

In some embodiments, the first optical source 531 and/or the second optical source 532 are distributed feedback (DFB) lasers, Fabry-Perot lasers, distributed Bragg reflector (DBR) lasers, other types of semiconductor lasers, or similar. One advantage of the system shown in FIG. 5 over the system shown in FIG. 4 is that in some cases, the comb 563 in FIG. 5 will have better signal-to-noise ratio (SNR) than the comb 463 in FIG. 4. This is because, in some embodiments, the first comb generator 410/510 and the second comb generator 420/520 are located in separate locations, and the SNR of the seeding tones 453'/553' will degrade between the filter/coupler 440/540 and the second comb generator 420/520. The system in FIG. 5 advantageously includes the local source(s) 531 and/or 532 and circulator(s) 522 and/or 523, which can regenerate the quality of the seeding tones 553'. In some embodiments, the local source(s) 531 and/or 532 are therefore lasers with relatively high power to regenerate the SNR of the seed tones 553'.

In some embodiments, mutual frequency locking/alignment between two combs is accomplished using one or more optical waves of a first comb as a reference to shift or align in frequency one or more optical waves of a second comb. In some embodiments, the optical wave of the first comb is a seed line of the first comb and the optical wave of the second comb is a seed line of the second comb. However, seed lines need not be center tones. In some embodiments, an off-center optical wave (i.e., a tone that is not the at the overall center frequency of the comb, and is not one of the two most central tones within the comb) of the second comb can be aligned in frequency to a corresponding off-center optical wave of the first comb to align the second comb to the first comb.

To elaborate, in some embodiments, the first comb and the second comb (of either the same, or distinct, frequency pitch) can be aligned by using one or more optical waves ("tones") of the first comb and of the second comb to determine a frequency difference between the corresponding optical waves. Then, by optoelectronic means, the optical wave of the second comb can be tuned, or locked, to the optical wave of the first comb to minimize the frequency difference. Because the first comb and the second comb are thus referenced to a single master line, the entire second comb is shifted such that one or more tones of the first comb and the second comb are mutually aligned in frequency.

In some embodiments, the comb alignment process entails a feedback mechanism relying on using a frequency difference as an error signal that is being driven to, and maintained, at zero. The alignment is accomplished by frequency shifting the seed line of the second comb by current injection, or alternatively thermal tuning, to minimize the error signal between the optical wave of the first comb and the optical wave of the second comb.

Figure 6:
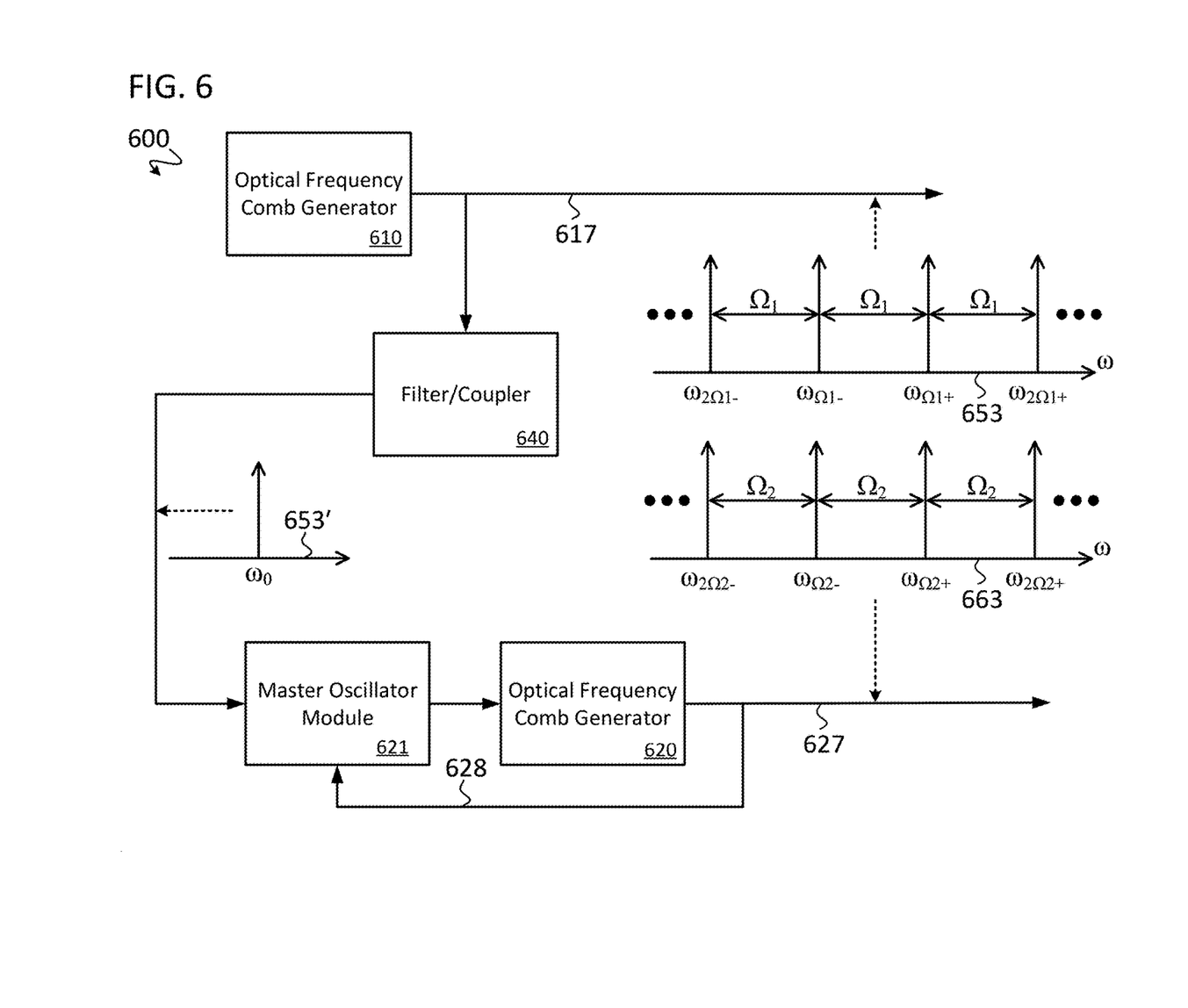
FIG. 6 illustrates a simplified schematic representation of still yet another system for mutual frequency alignment of optical frequency combs, in accordance with some embodiments.

FIG. 6 illustrates a simplified schematic representation of yet another embodiment of a system 600 for mutual frequency alignment of optical frequency combs. In the embodiment shown, mutual frequency alignment between a first optical frequency comb and a second optical frequency comb is accomplished by using one or more tones of the first optical frequency as a reference to align, in frequency, the second optical frequency comb.

As shown, the system 600 generally includes a first optical frequency comb generator 610, a second optical frequency comb generator 620, a first optical link 617, a second optical link 627, an optical filter/coupler 640, and a master oscillator module 621, among other components not shown for simplicity. The first optical frequency comb generator 610 is coupled to the first optical link 617, onto which it launches a first optical frequency comb 653. The second optical frequency comb generator 620 is coupled to the second optical link 627, onto which it launches a second optical frequency comb 663. The filter/coupler 640 is coupled to the first optical link 617 and the master oscillator module 621. The master oscillator module 621 is coupled to the optical frequency comb generator 620 and is coupled to the second optical link 627 by a feedback link 628. The feedback link 628 may include intervening hardware such as optical filters and/or optical coupling elements which are not shown for the sake of simplicity. The second comb generator 620 is, in some embodiments, similar to any one of the second optical comb generators 320, 420 or 520.

The second comb generator 620 generates the second optical frequency comb 663 based on one or more seed lines generated by the master oscillator module 621 and received by the second comb generator 620. The filter/coupler 640 causes one or more optical tones 653' of the first optical frequency comb 653 (e.g., a tone $\omega_0$ corresponding to one or more of the tones of the first optical frequency comb 653) to be received by the master oscillator module 621. The master oscillator module 621 additionally receives one or more optical tones of the second optical frequency comb 663 via the feedback link 628. The one or more received optical tones may include the tone ωo, as shown in FIG. 6, or another tone or tones of the second optical frequency comb 663 that correspond to a tone or tones of the first optical frequency comb 653.

In some embodiments, the master oscillator module 621 implements an optical phase locked loop (OPLL). The master oscillator module 621 uses the one or more optical tones 653' (e.g., a central optical tone of the first optical frequency comb 653) to align one or more optical tones of the second optical frequency comb 663. In some embodiments, the alignment is performed by a frequency feedback loop, having an error signal based on the frequency separation between the one or more optical tones 653' and the one or more optical tones of the second optical frequency comb 627 received by the master oscillator module 621 from the feedback link 628. The error signal is minimized to tune or adjust the one or more seed lines generated by the master oscillator module 621, which are then used by the second comb generator 620 to generate the second optical frequency comb 663, or to align or shift, in frequency, the second optical frequency comb 663 which may already exist before frequency alignment occurs. Thus, the frequency of the one or more optical tones (e.g. a seed, or other tone) of the second optical frequency comb 663 are tuned, in relationship to the frequency separation sensed (i.e., the loop error signal) by the master oscillator module 621, so as to minimize (or ultimately cancel) the frequency separation between the respective optical frequency tones used for frequency offset estimation.

The effect of tuning the one or more master optical tones (i.e., seed lines generated by the master oscillator module 621) using the one or more optical tones 653' of the first optical frequency comb 653 has the effect of a displacement (shifting) of the entire second optical frequency comb 663 spectra by the same amount (as that of the one or more seed lines). In some embodiments, the tuning of the second optical frequency comb 663 using the optical tones 653' and/or using the feedback link 628 is accomplished by one of, current injection, cavity detuning, thermal tuning, or some other means. In some embodiments, the master oscillator 621 uses an "optical-only alignment process". The term "optical-only alignment process", as used herein, refers to a process performed by the master oscillator (e.g., element 621 in FIG. 6) that operates with optical tones only, and does not convert the incoming optical tones (e.g., 653' and 628) into electrical signals and then back into optical tones to be provided to the optical frequency comb generator 620. In other embodiments, the master oscillator 621 uses an "optical and electronic alignment process". The term "optical and electronic alignment process", as used herein refers to a process performed by the master oscillator (e.g., element 621 in FIG. 6) that converts the incoming optical tones (e.g., 653' and 628) into electrical signals and then converts the generated electrical signals back into optical tones to be provided to the optical frequency comb generator 620. In embodiments where the master oscillator 621 operates with optical tones only, then the input 653' to the master oscillator module 621 needs to be a central tone from comb 653. In embodiments where the master oscillator 621 converts optical tones into electrical signals, then the input 653' to the master oscillator module 621 can be any tone from comb 653.

As shown, center frequencies of the tones of the first comb 653 have equidistant frequency spacing $\Omega_1$, and center frequencies of the tones of the second comb 663 have equidistant frequency spacing $\Omega_2$. In some embodiments, $\Omega_1$ is equal to $\Omega_2$. In other embodiments, $\Omega_1$ is not equal to $\Omega_2$.

In some embodiments, a non-central line in the first comb emission spectrum can be used for frequency referencing. In some embodiments, referencing can be accomplished through injection locking of a comb seed of the slave comb. In some embodiments, a waveform of the first comb need not be physically used in the comb formation process of the second comb, but can be used for a frequency difference feedback signal, such that the second comb is effectively tuned until the aforementioned frequency difference signal is driven to and maintained at a satisfactorily small value. In some embodiments, methods can be used for referencing of combs of unequal pitches—having a common frequency emission line.

In some embodiments, multiple combs (e.g., more than 2, more than 10, more than 100, or from 2 to 1000) are connected in a network, and it can be desirable that some or all of the combs in the network can be aligned. The systems and methods described above can be used to align multiple combs connected in a network. In some embodiments of multiple comb generators are connected in a network, the first comb to serve as the alignment source can be referred to as an overall master comb, and any comb that is used to align a comb can be referred to as a predecessor comb (or a precursor comb, or an immediate master comb). In particular, it is critical that the sequential comb alignment follows an order, or hierarchy designed so as to be devoid of loops. A "loop" occurs when a predecessor comb becomes a master comb to (i.e., is used for alignment for) one of its own predecessors. Loops can occur when the order of alignment is ambiguous, or not well defined, which can cause competition and adverse pulling of comb references between combs in the network (e.g., loops can cause seed lines of differing frequencies to be used to align different combs in the network, or the same comb at different times). In one example of a hierarchical comb alignment (i.e., an alignment order and/or scheme that avoids loops), a first comb in the network is used to align a second comb in the network, and then a third comb is aligned to the first or second comb, and then each subsequent comb in the network is aligned to a comb that is already aligned to another comb. Generally, after the first two combs in the network are aligned, each time a comb in the network is aligned, it will also be aligned to a comb that had already been aligned to another comb in the network. In some embodiments, the alignment of combs in a network comprising a plurality of combs is sequential, and the sequential alignment follows a particularly predetermined order (hierarchy) of alignment, whereby one comb is aligned at a time to its predecessor, or an immediate master comb. In other embodiments, more than one comb in a network comprising a plurality of combs can be aligned in parallel, with a defined hierarchy (i.e., without ambiguity which can cause loops). For example, a first comb can be aligned to a second comb in the network, and then a third comb can be aligned to the first comb and a fourth comb can be aligned to the second comb simultaneously. In some embodiments, the parallel alignment can proceed in such a way that an alignment tree results, and at any instant many combs can be aligned in parallel. In other embodiments, a tone of the first comb (i.e., a master line) can be used for referencing more than one comb. In other embodiments, referencing of multiple combs can be achieved in a daisy-chained fashion (e.g., a sequential arrangement with a particular order) for a potentially large number of the comb generators, while maintaining the strict order, or sequence of alignment.

In some embodiments, multiple combs are connected in a network, and the frequency of some or all of the tones in each of the combs in the network can be aligned by initially establishing the combs based on a master and predecessor combs. In other embodiments, multiple combs are connected in a network which are already established, and the frequency of some or all of the tones in each of the combs in the network can be aligned by adjusting the frequency of the established combs. In other embodiments, multiple combs are connected in a network which are already established and initially aligned, and the frequency of some or all of the tones in each of the combs in the network can be periodically realigned by adjusting the frequency of the established and initially aligned combs.

In connecting (e.g., in a daisy-chain configuration) a plurality of comb sources with the intention of forming a frequency-grid reference in a network containing multiple sites (or nodes), a free mutual locking of comb sources can lead to competition and adverse pulling of comb references, which can result in an unstable system. Therefore, in some embodiments, when a plurality of comb sources need to be aligned (i.e., locked), or a similar frequency-grid reference needs to be established, in a network environment, it is beneficial to establish a particular hierarchy in precedence, or an order of locking. In some embodiments, each of the comb sources has a particular reference master, or a predecessor (or an immediate master) to which it is locked. Furthermore, and particularly of interest in a reconfigurable network, the master (or a predecessor) mapping (i.e., the hierarchy in locking precedence, or the order of locking) can also be reconfigurable. Additionally, even in a non-intentionally reconfigurable network, there may exist an ordered list of the locking order that is reconfigurable. For example, a reconfigurable ordered list of the locking order can cater to the eventuality of a partial network failure, thereby ensuring persistence of the frequency-grid reference in the surviving part of the network. In such a situation, the ordered list can be reconfigured into an alternative ordered list of comb sources (or network nodes) including those nodes of the surviving part of the network. The described frequency-grid reference locking across the network can be implemented at the initialization, or when adding a new node (i.e., a new comb) to the network. Additionally, the locking procedure, or adjustment (or tuning) can be performed in a periodic fashion, or continuously in time.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A system comprising:
a first optical frequency comb generator that generates a first parametrically generated comb using parametric mixing comprising a first plurality of optical waves including at least one first optical wave; and
a second optical frequency comb generator that generates a second parametrically generated comb using parametric mixing comprising a second plurality of optical waves;
wherein the second optical frequency comb generator receives the at least one first optical wave; and
wherein respective center frequencies of one or more optical waves of the second plurality of optical waves are aligned in frequency with respective center frequencies of one or more optical waves of the first plurality of optical waves using the at least one first optical wave.

2. The system of claim 1, wherein:
the respective center frequencies of one or more optical waves of the second plurality of optical waves are aligned in frequency with respective center frequencies of one or more optical waves of the first plurality of optical waves by generating the second plurality of optical waves using the at least one first optical wave.

3. The system of claim 1, wherein:
the respective center frequencies of one or more optical waves of the second plurality of optical waves are aligned in frequency with respective center frequencies of one or more optical waves of the first plurality of optical waves by aligning in frequency at least one optical wave of the second plurality of optical waves to the at least one first optical wave by minimizing a frequency difference between the at least one first optical wave and the at least one optical wave of the second plurality of optical waves.

4. The system of claim 1, wherein:
the respective center frequencies of one or more optical waves of the second plurality of optical waves are aligned in frequency with respective center frequencies of one or more optical waves of the first plurality of optical waves by aligning a seed line of the second parametrically generated comb to the at least one first optical wave.

5. The system of claim 1, wherein:
the phase of the one or more optical waves of the second plurality of optical waves are not aligned the phase of the one or more optical waves of the first plurality of optical waves.

6. The system of claim 1, further comprising:
an optical source; and
a circulator coupled to the optical source;
wherein the respective center frequencies of the one or more optical waves of the second plurality of optical waves are aligned in frequency with respective center frequencies of one or more optical waves of the first plurality of optical waves by tuning an optical output from the optical source to the at least one first optical wave using the circulator using injection locking.

7. The system of claim 1, wherein:
the first plurality of optical waves comprises a first optical wave and a second optical wave;
the system further comprises:
a first optical source;
a second optical source;
a first circulator coupled to the second optical source;
a second circulator coupled to the second optical source;
an optical splitter wherein outputs of the optical splitter are coupled to the first and second circulators;

an optical combiner wherein:
inputs of the optical combiner are coupled to the first and second circulators; and
an output of the optical combiner is coupled to a parametric optical mixer, wherein the output of the parametric optical mixer comprises the second plurality of optical waves; and
the respective center frequencies of the one or more optical waves of the second plurality of optical waves are aligned in frequency with respective center frequencies of one or more optical waves of the first plurality of optical waves by tuning the optical outputs from the first and second optical sources to the first and second optical waves using the first and second circulators using injection locking.

8. The system of claim 1, wherein:
the system further comprises:
 an optical source;
 a circulator coupled to the optical source;
 an optical modulator with an input coupled to the circulator; and
 a parametric optical mixer with an input coupled to the output of the optical modulator,
the output from the optical source is tuned to the first optical wave using the first circulator using injection locking;
the optical modulator receives the output from the circulator, and outputs at least two second optical waves; and
the output of the parametric optical mixer comprises the second plurality of optical waves.

9. The system of claim 1, further comprising:
a master oscillator, wherein
the respective center frequencies of one or more optical waves of the second plurality of optical waves are aligned in frequency with respective center frequencies of one or more optical waves of the first plurality of optical waves using an optical-only alignment process performed by the master oscillator.

10. The system of claim 1, further comprising:
an optical and electronic master oscillator, wherein
the respective center frequencies of one or more optical waves of the second plurality of optical waves are aligned in frequency with respective center frequencies of one or more optical waves of the first plurality of optical waves using an optical and electronic alignment process performed by the master oscillator.

11. A system comprising:
a first optical frequency comb generator that generates a first parametrically generated comb using parametric mixing comprising a first plurality of optical waves including a first optical wave, wherein the first plurality of optical waves are characterized by respective center frequencies separated from each other by a first frequency spacing, and the first optical wave is characterized by a first center frequency; and
a second optical frequency comb generator that generates a second parametrically generated comb using parametric mixing comprising a second plurality of optical waves, wherein the second plurality of optical waves are characterized by respective center frequencies separated from each other by a second frequency spacing, and the second optical frequency comb generator further comprises:
 an optical modulator optically coupled to the first optical frequency comb generator to: (i) receive the first optical wave, and (ii) output at least two second optical waves using the first optical wave; and
 a parametric optical mixer optically coupled to the optical modulator to: (i) receive the at least two second optical waves, and (ii) mix at least two second optical waves to output the second plurality of optical waves; and
wherein the respective center frequencies of one or more optical waves of the first plurality of optical waves are aligned in frequency with respective center frequencies of one or more optical waves of the second plurality of optical waves.

12. The system of claim 11, wherein:
the phase of the one or more optical waves of the second plurality of optical waves are not aligned the phase of the one or more optical waves of the first plurality of optical waves.

13. A system comprising:
a network comprising a plurality of optical frequency comb generators that generate a plurality of parametrically generated combs using parametric mixing, comprising:
 a master optical frequency comb generator that generates a master parametrically generated comb comprising a first plurality of optical waves including at least one first optical wave;
 a first predecessor optical frequency comb generator that generates a first predecessor parametrically generated comb comprising a second plurality of optical waves;
 one or more additional predecessor optical frequency comb generators that generate a plurality of additional predecessor parametrically generated combs comprising subsequent pluralities of optical waves; and
 a hierarchical order of alignment for the plurality of optical frequency comb generators in the network;
wherein the first predecessor optical frequency comb generator receives the at least one first optical wave;
wherein respective center frequencies of one or more optical waves of the second plurality of optical waves are aligned in frequency with respective center frequencies of one or more optical waves of the first plurality of optical waves using the at least one first optical wave.

14. The system of claim 13, wherein:
the hierarchical order of alignment for the plurality of optical frequency comb generators in the network comprises a sequential alignment of the one or more additional predecessor optical frequency comb generators, wherein one additional predecessor optical frequency comb generator is aligned at a time.

15. The system of claim 13, wherein:
the hierarchical order of alignment for the plurality of optical frequency comb generators in the network comprises a sequential alignment of the one or more additional predecessor optical frequency comb generators, wherein more than one of the additional predecessor optical frequency comb generators is aligned at a time.

16. The system of claim 13, wherein:
the predecessor and additional predecessor optical frequency comb generators in the network are periodically realigned after an initial alignment is performed.

17. The system of claim 13, wherein:
the hierarchical order of alignment for the plurality of optical frequency comb generators in the network:

comprises a reconfigurable ordered list of the alignment order of the plurality of the optical frequency comb generators; and in the eventuality of a partial network failure, ensures persistence of a frequency-grid reference in a surviving part of the network.

\* \* \* \* \*